United States Patent
Kugler et al.

(10) Patent No.: US 6,575,611 B2
(45) Date of Patent: *Jun. 10, 2003

(54) SUPPORT, ESPECIALLY FOR TAILLIGHTS OF MOTOR VEHICLES, AS WELL AS METHOD FOR FASTENING ELECTRONIC COMPONENTS, PREFERABLY LEDS, TO SUCH A SUPPORT

(75) Inventors: Achim Kugler, Murrhardt (DE); Christine Weber, Esslingen (DE)

(73) Assignee: Reitter & Schefenacker GmbH & Co. KG, Esslingen (*) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/133,364

(22) Filed: Aug. 12, 1998

(65) Prior Publication Data

US 2002/0067621 A1 Jun. 6, 2002

(30) Foreign Application Priority Data

Aug. 12, 1997 (DE) .......................................... 197 34 748

(51) Int. Cl.[7] ............................................... H05K 1/00
(52) U.S. Cl. ...................... 362/543; 362/544; 362/545; 362/800
(58) Field of Search ................................. 362/543, 544, 362/545, 249, 252, 800; 439/83, 56; 219/121.63, 121.64

(56) References Cited

U.S. PATENT DOCUMENTS

| | | | | | |
|---|---|---|---|---|---|
| 3,612,855 | A | * | 10/1971 | Juhnke ........................ | 362/227 |
| 4,591,954 | A | * | 5/1986 | Kawamura et al. ......... | 362/545 |
| 4,772,989 | A | * | 9/1988 | Haraden ..................... | 362/226 |
| 5,404,282 | A | * | 4/1995 | Klinke et al. ............... | 362/800 |
| 5,490,049 | A | * | 2/1996 | Montalan et al. .......... | 362/545 |
| 5,609,491 | A | * | 3/1997 | Cooper et al. ................ | 439/79 |
| 5,665,473 | A | * | 9/1997 | Okoshi et al. .............. | 428/457 |
| 5,747,920 | A | * | 5/1998 | Devir et al. ........... | 313/318.09 |
| 5,765,940 | A | * | 6/1998 | Levy et al. .................. | 362/800 |
| 5,807,122 | A | * | 9/1998 | Heeb et al. .................... | 439/83 |

\* cited by examiner

Primary Examiner—Thomas M. Sember
(74) Attorney, Agent, or Firm—Gudrun E. Huckett

(57) ABSTRACT

A support for a taillight of a motor vehicle has a support member and electric leads connected thereto. Electronic components are connected by welding seams produced by laser welding to the electric leads.

11 Claims, 2 Drawing Sheets

SUPPORT, ESPECIALLY FOR TAILLIGHTS OF MOTOR VEHICLES, AS WELL AS METHOD FOR FASTENING ELECTRONIC COMPONENTS, PREFERABLY LEDS, TO SUCH A SUPPORT

BACKGROUND OF THE INVENTION

The present invention relates to a support, preferably for taillights of motor vehicles, comprising electronic components, especially LEDs, connected to electric leads.

The present invention also relates to a method for fastening electronic components, preferably LEDs, to such a support, respectively, its electric leads.

Known supports of this kind are embodied with electrical leads which are arranged within taillights of motor vehicles behind a transparent window and on which incandescent light bulbs are secured by lamp sockets.

There are also supports known which have LEDs connected thereto by soldering. However, when connecting LEDs to a support by soldering, temperature related problems result. The LEDs can easily be damaged because the temperature for soldering can easily surpass a predetermined limit. This can result in a shortening of the service life of the LEDs. Also, for three dimensional components the soldering process requires special, very expensive plastic materials that are highly temperature resistant.

It is also known, for the purpose of avoiding such temperature damage to LEDs, to employ a so-called snap-on technology, i.e., a mechanical connection for fastening the LEDs to the support. However, this has the disadvantage that for such a method only LEDs of a certain size and shape can be used. In order not to damage the LEDs during the mounting process, they must have a minimum size and a certain design. The LEDs thus require relatively large space on the support. Furthermore, for mounting such LEDs, special complicated and expensive tools are required.

It is therefore an object of the present invention to embody the aforementioned support and the aforementioned method such that the electronic components can be mounted on the support in a simple and inexpensive manner while preventing possible damage.

SUMMARY OF THE INVENTION

The inventive support has LEDs or other heat-sensitive electronic components connected thereto by laser welding. For this purpose, high-powered lasers are used which have a very short pulse, high pulse frequency and very high output. This allows to attach the electronic components within a very short period of time and without the risk of damaging the electronic components such as chips, etc. The inventive laser welding process prevents extensive heat loading of the support and of the electronic components. Furthermore, the electronic components can be securely and safely attached to the support so that a reliable connection is provided. The electronic components may also be small-sized LEDs because the inventive mounting technique does not require a special design of the LEDs. The support member can be comprised of a plastic material that has reduced temperature resistance and is thus less expensive. Also, the pairing of materials is less critical as compared to conventional supports where the electronic components are attached by soldering to the support member. This is also beneficial with regard to the manufacturing costs of the inventive support. The inventive laser welding process can be performed with welding robots in a very short period of time.

BRIEF DESCRIPTION OF THE DRAWINGS

The object and advantages of the present invention will appear more clearly from the following specification in conjunction with the accompanying drawings, in which.

DESCRIPTION OF PREFERRED EMBODIMENTS

The present invention will now be described in detail with the aid of several specific embodiments utilizing FIGS. 1 through 3.

Figure 1:
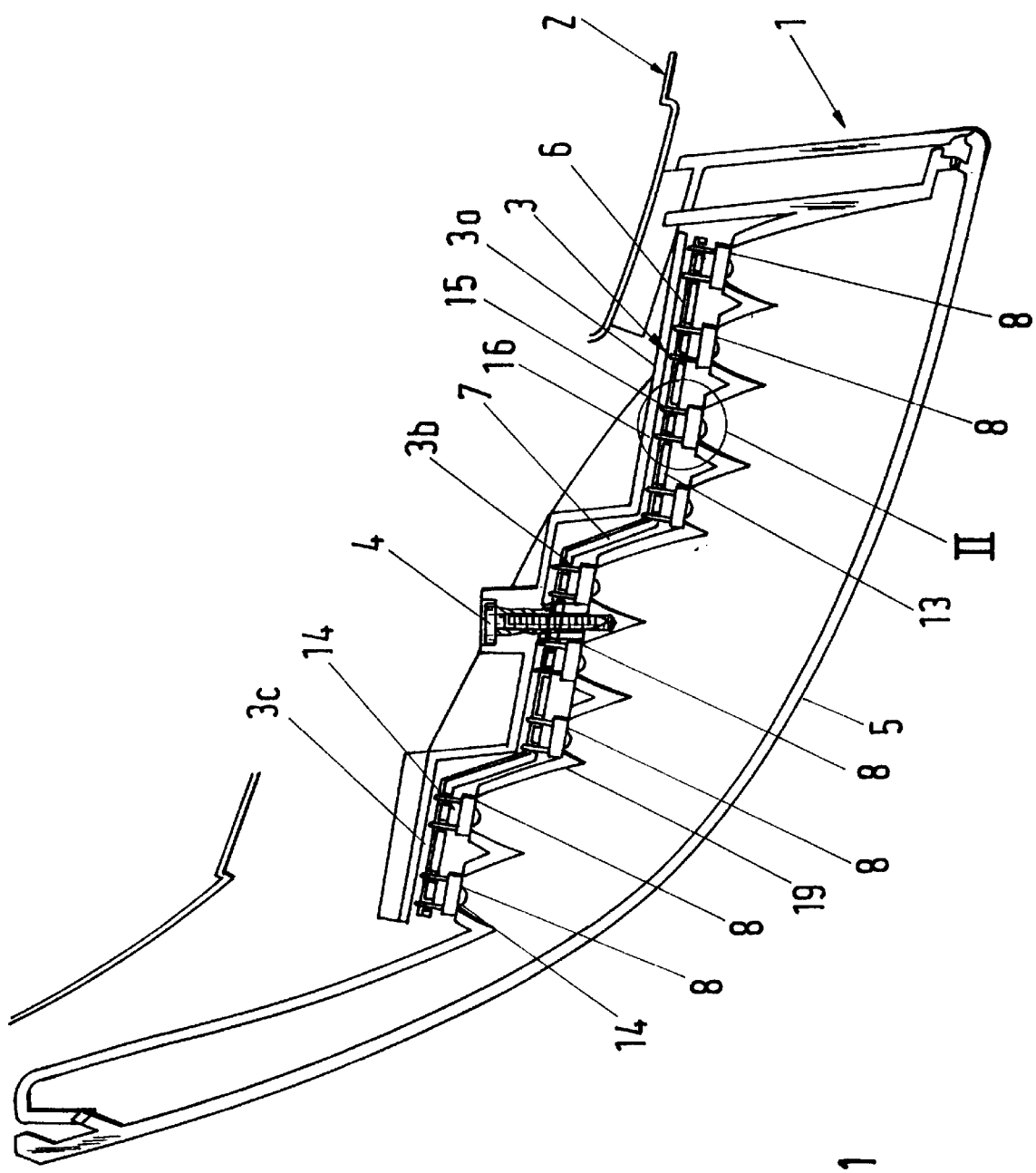
FIG. 1 shows a section of a motor vehicle taillight with the inventive support on which a plurality of LEDs are attached.
Figure 2:
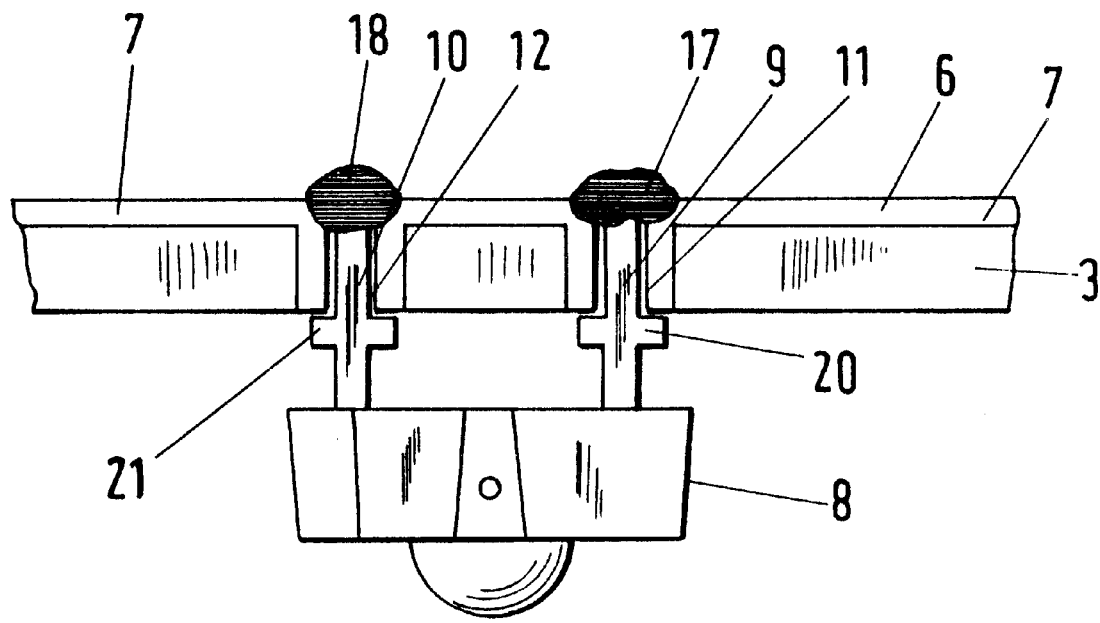
FIG. 2 shows the detail 11 of FIG. 1 in which one of the LEDs is welded to the support member.

FIG. 1 shows a taillight 1 of a motor vehicle in which the car body 2 of the motor vehicle is schematically indicated. The taillight 1 has a support member 3 which is connected to the car body 2 by screws 4. Electric leads 7 are provided on the support member 3 to which electronic components in the form of LEDs 8 are attached. The support member 3 is positioned at a distance from the transparent window or cover 5 which closes off the taillight 1.

The support member 3 is comprised preferably of a highly temperature resistant thermolplastic material to which electric leads 7 consisting of metal have been applied. The support member 3 can also be produced by injection molding a plastic material such as polycarbonate about the electric leads. Advantageously, the support member 3 is an injection molded part which is provided with an integrated lead structure. The support member 3 in the shown embodiment is a three dimensional component that comprises three step portions 3a, 3b, and 3c of different width onto which a plurality of LEDs 8 has been mounted. The first and widest step portion 3a comprises for serially arranged LEDs 8 while the step portion 3b in the middle has only three rows of LEDs. The step portion 3c is the narrowest one and supports only two rows of LEDs. Of course, the arrangement of the step portions and LEDs can be selected as desired. Instead of a stepped embodiment, the support member 3 can also be of a curved embodiment. The support member can also be embodied "two-dimensionally" as a plate.

Each LED 8 projects with its two legs 9, 10 (FIG. 2) through through bores 11, 12 of the support 3. The legs 9, 10 are inserted through the through bores 11, 12 to such an extent that they contact with abutments 20, 21, positioned on the legs, the support member 3 so that their free ends 15, 16 (FIG. 1) project past the backside 6 of the support member 3. The ends 15, 16 of the legs 9, 10 of the LED 8 are then welded to the backside 6 of the support member 3 by laser welding in order to provide contact with the electric leads 7. FIG. 2 shows the resulting welding seam or welding location 17, 18. The laser welding step is carried out with a high-powered laser which is characterized by short pulses, a high pulse sequence, and a very high output. Accordingly, the LEDs during the welding process are subjected only to minimal heat stress so that damaging of the LEDs is prevented. Laser welding allows for mounting of the LEDs in a simple manner and within a very short period of time. With this method a very safe welding of the LEDs 8 to the support member 3 is possible whereby the support member 3 is exposed only to very short periods of heat. Furthermore, for producing the support member, since only a minimal heat loading will result, plastic materials of reduced temperature-resistance and thus more inexpensive materials can be used. Finally, the material pairing is less critical than for conventional soldering methods. In the disclosed high-powered laser welding process, the LEDs can be of a relatively small design because for their mounting no special design or shape is required. For mounting the LEDs 8 a welding robot can be employed with which the LEDs can be welded quickly and reliably to the support member 3. The LEDs are advantageously automatically inserted into the support member 3 and then welded in the afore disclosed manner from behind to the support member 3.

Figure 3:
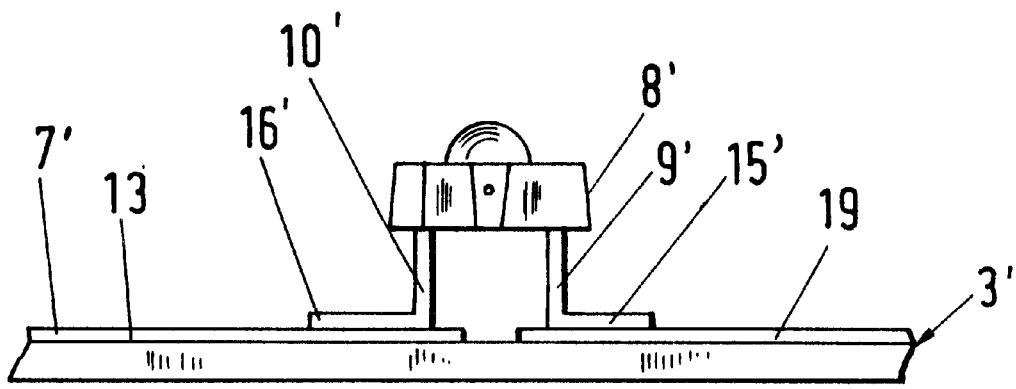
FIG. 3 shows a portion of the inventive support having an LED welded thereto.

FIG. 3 shows a further embodiment of a support member 3 in which the LEDs 8' are welded to the front side 13 of the support member 3'. The support member 3' can be of a three-dimensional construction, as disclosed above, or provided with a plurality of step portions, but can also be curved or only two-dimensional. The LEDs 8' have legs 9', 10' which at about half their length are angled at a right angle in the outward direction and thus have ends 15', 16' pointing in opposite directions. For mounting, the LEDs 8' are placed with their angled ends 15', 16' onto the respective electric leads 7' on the front side 13 of the support member 3' and are welded thereto by laser welding. This is again performed by a high-powered laser with which the LEDs 8' are securely attached to the support member 3' in a very short period of time and with minimal temperature (heat) loading. Mounting of the LEDs 8' is very simple and very quick because the legs 9', 10' must only be placed onto the electric leads 7' instead of having to be inserted into openings within the support member.

The LEDs 8, 8' project through openings 14 (FIG. 1) into a reflector 19 which is positioned opposite the transparent window or cover 5 of the taillight. The support member 3, 3' is arranged at the side of the reflector 19 facing away from the transparent window 5 and is advantageously connected together with the reflector 19 by screws 4 to the car body 2.

The specification incorporates by reference the disclosure of German priority document 197 34 748.7 of Aug. 12, 1997.

The present invention is, of course, in no way restricted to the specific disclosure of the specification and drawings, but also encompasses any modifications within the scope of the appended claims.

What is claimed is:

1. A support for a taillight of a motor vehicle, said support comprising:
    a support member (3, 3');
    electric leads connected to said support member (3, 3');
    electronic components (8, 8') connected by laser welding seams (17, 18) to said electric leads (7, 7'), each said electric component having at least one L-shaped connecting part (9', 10') comprised of a first leg (15', 16') and a second leg, said second leg forming a unitary part of each said electric component (8, 8'), wherein said first leg (15', 16') is connected by one of said laser welding seams to said support member (3'), wherein said first leg (15', 16') is connected to said electric leads (7, 7') of said support member (3, 3') without interposition of a further connecting piece between said first leg (15', 16') and said electric leads (7, 7'), such that said first leg (15', 16') lies flat on said electric leads (7, 7'), and wherein said second leg is a unitary part of each said electronic component (8, 8').

2. A support according to claim 1, wherein said support member (3, 3') has a front side (13) and a back side (6), wherein said welding seams (17, 18) are located at least at one of said front side (113) and said back side (6).

3. A support for a taillight of a motor vehicle 1 said support comprising:
    a support member (3, 3');
    electric leads (7, 7') connected to said support member (3, 3');
    electronic components (8, 8') connected by welding seams (17, 18) produced by laser welding to said electric leads (7, 7');
    wherein said support member (3, 3') has a front side (13) and a back side (6), wherein said welding seams (17, 18) are located at least at one of said front side (113) and said back side (6);
    wherein said support member (3, 3') has at least one through bore (11, 12) and said electronic components (8, 8') each have at least one connecting part (9, 10), wherein said at least one connecting part (9, 10) projects through said at least one through bore (11, 12), wherein said at least one connecting part (9, 10) has a projecting end (15, 16) connected by one of said welding seams to said back side (6).

4. A support according to claim 2, wherein said L-shaped end (15', 16') is connected to said front side (13').

5. A method for fastening electronic components to a support, said method comprising the steps of:
    placing electronic components (8, 8') on a support member (3, 3') having electrical leads (7, 7');
    providing each one of said electronic components (8, 8') with at least one L-shaped connecting part (9, 10; 9, 10'), said at least one L-shaped connecting part having a first leg (15', 16') and a second leg, said second leg forming a unitary part of said electric component (8, 8');
    laser-welding said first leg of said electronic components (8, 8') to said electrical leads (7, 7') without interposition of a further connecting piece between said first leg (15', 16') and said electric leads (7, 7'), such that said first leg (15', 16') lies flat on said electric leads (7, 7').

6. A method according to claim 5, wherein said step of laser-welding is performed by a welding robot.

7. A method according to claim 5, wherein said first leg is positioned at a front side (13) of said support member (3').

8. A taillight for a motor vehicle having a cover portion, comprising:
    a support, including a support member (3, 3') positioned at a distance from said cover portion;
    electric leads (7, 7') connected to said support member (3, 3');
    electronic components (8, 8') connected by at least one welding seam (17, 18) produced by laser welding to said electric leads (7, 7'), wherein said support member (3, 3') has at least one through bore (11, 12) and electronic components (8, 8') each have at least one connecting part (9, 10), said at least one connecting part (9, 10,) projecting through said at least one bore (11, 12) and having a projecting end (15, 16) connected by one of said welding seams to a side (6) of said support member.

9. A support for a taillight of a motor vehicle, said support comprising:
    a support member (3, 3') having at least one through bore (11, 12);
    electric leads (7, 7') connected to said support member (3, 3');
    electronic components (8, 8') each having at least one connecting part (9, 10), said at least one connecting part (9, 10) projecting through said at least one through bore (11, 12), said at least one connecting part (9, 10) including an abutment portion (20, 21) extending outwardly therefrom, said abutment portion abutted against a side of said support member (3, 3') when said connecting portion (9, 10) is projected through said at least one bore, wherein said at least one connecting part (9, 10) has a projecting end (15, 16) connected by a welding seam to a side of said support member.

10. A taillight of a motor vehicle having a cover portion, comprising:

a support, including a support member (3, 3') positioned at a distance from said cover portion and having at least one through bore (11, 12);

electric leads (7, 7') connected to said support member (3, 3');

electronic components (8, 8') each having at least one connecting part (9, 10), said at least one connecting part (9, 10) projecting through said at least one through bore (11, 12), said at least one connecting part (9, 10) including an abutment portion (20, 21) extending outwardly therefrom, said abutment portion abutted against a side of said support member (3, 3') when said connecting portion (9, 10) is projected through said at least one bore, wherein said at least one connecting part (9, 10) has a projecting end (15, 16) connected by a welding seam to a side of said support member.

11. A method for fastening electronic components to a support, said method comprising the steps of:

placing electronic components (8, 8') on a support member (3, 3') having electric leads (7, 7');

providing each one of said electronic components (8, 8') with at least one connecting part (9, 10; 9', 10'), wherein in said step of placing, said at least one connecting part (9, 10; 9', 10') is positioned onto said support member (3, 3') and said at least one connecting part (9, 10; 9', 10') is welded to said electric leads (7, 7');

laser-welding said at least one connecting part (9, 10; 9', 10') to said electric leads (7, 7'); and providing said support member (3) with through bores (11, 12), inserting said at least one connecting part (9, 10) into one of said through bores (11, 12) and in said step of laser-welding, welding a projecting end (15, 16) of said at least one connecting part (9, 10) to said electric leads (7, 7').

* * * * *